United States Patent [19]
Allen et al.

[11] Patent Number: 6,038,168
[45] Date of Patent: Mar. 14, 2000

[54] HOT-ELECTRON PROGRAMMABLE LATCH FOR INTEGRATED CIRCUIT FUSE APPLICATIONS AND METHOD OF PROGRAMMING THEREFOR

[75] Inventors: Archibald J. Allen, Shelburne; Jerome B. Lasky, Essex Junction; John J. Pekarik, Underhill; Jed H. Rankin, Burlington; Francis R. White, Essex Junction, all of Vt.

[73] Assignee: International Business Machines Corporation, Armonk, N.Y.

[21] Appl. No.: 09/105,339

[22] Filed: Jun. 26, 1998

[51] Int. Cl.[7] .................................................. G11C 7/00
[52] U.S. Cl. ................. 365/185.07; 365/185.05; 365/154; 365/156
[58] Field of Search ................. 365/185.07, 185.05, 365/154, 156, 185.08

[56] References Cited

U.S. PATENT DOCUMENTS

| | | | |
|---|---|---|---|
| 4,852,063 | 7/1989 | McNutt | 365/185 |
| 5,018,102 | 5/1991 | Houston | 365/95 |
| 5,311,470 | 5/1994 | Atsumi et al. | 365/185.07 |
| 5,345,110 | 9/1994 | Renfro et al. | 307/272.3 |
| 5,517,634 | 5/1996 | Ehrlich | 395/493 |
| 5,523,971 | 6/1996 | Rao | 365/189.07 |
| 5,581,505 | 12/1996 | Lee | 365/189.11 |
| 5,757,696 | 5/1998 | Matsuo et al. | 365/185.07 |
| 5,856,941 | 1/1999 | Keyse et al. | 365/185.07 |

OTHER PUBLICATIONS

Programable Compare Circuit, K.E. Beilstein, R.A. Lipa IBM Technical Disclosure Bulletin, Aug. 1987, No. 280.

*Primary Examiner*—Vu A. Le
*Attorney, Agent, or Firm*—John J. Goodwin

[57] ABSTRACT

A method and apparatus for conditioning an integrated circuit to always enter a desired operating state when actuated by permanently altering at least one component device. An integrated circuit is provided with at least one component transistor wherein a constant high voltage is applied only once to the drain electrode of the transistor for one predetermined period of time while concurrently a constant voltage lower than the high voltage is applied only once to the gate electrode of the transistor, thus causing a permanent channel hot-electron alteration of a gate oxide of the transistor. The integrated circuit may include a plurality of programmable circuits, each capable of assuming a plurality of readable data states when powered up, and each including a plurality of programmable devices for permanently biasing its corresponding programmable circuit to assume one of the readable states upon subsequent power ups.

15 Claims, 2 Drawing Sheets

HOT-ELECTRON PROGRAMMABLE LATCH FOR INTEGRATED CIRCUIT FUSE APPLICATIONS AND METHOD OF PROGRAMMING THEREFOR

BACKGROUND OF THE INVENTION

1. Field of the Invention

The present invention relates to programmable integrated circuit devices, and more particularly to a method and apparatus for hot-electron channel altering the characteristics of an integrated circuit by means of programmable circuits.

2. Background Art

At present, integrated circuits are altered by making discretionary connections using either fusible links or anti-fusible links, wherein a fusible link is one that provides a closed connection when first formed and an antifusible link is one that provides an open connection when first formed.

Typical examples of fuse technology are described in U.S. Pat. No. 5,345,110 issued Sep. 6, 1994 to Renfro et al., U.S. Pat. No. 5,581,505 issued Dec. 3, 1996 to Lee.

Other techniques for altering integrated circuits are described in U.S. Pat. No. 5,517,634 issued May 14, 1996 to Ehrlich that discloses modifying the threshold characteristics of pass transistors with hot electrons, U.S. Pat. No. 5,018,102 issued May 21, 1991 to Houston that discloses the use of capacitors to force a CMOS memory cell to assume a desired logic state when power is applied to the device, and U.S. Pat. No. 4,852,063 issued Jul. 25, 1989 to McNutt discloses a technique wherein an avalanche voltage is used to program a nonvolatile memory.

A publication entitled "Programmable Compare Circuit" by K. E. Beilstein and R. A. Lipa in RESEARCH DISCLOSURE, August 1987, Number 280 by Kenneth Mason Publications Ltd, England discloses a technique wherein a hot electron threshold shift is used to program a compare circuit which can be used to eliminate the need for laser fuse blowing to access redundant circuits.

SUMMARY OF THE INVENTION

An object of the present invention is to provide a method and apparatus for permanently altering an integrated circuit by electrical means.

Another object of the present invention is to provide a method and apparatus for permanently altering an integrated circuit by encoding information without requiring a separate operation.

Still another object of the present invention is to provide a method and apparatus for permanently altering an integrated circuit by encoding information using channel hot-electron techniques.

A further object of the present invention is to provide a method and apparatus for programming an integrated circuit to always enter a desired operating state when actuated by permanently altering at least one component device.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms Like numerals refer to like parts throughout the disclosure.

DETAILED DESCRIPTION OF THE INVENTION

Fuses are employed in integrated circuits to encode information on a circuit chip at the time of manufacture. The encoded information is used to later identify the chip, to enable or tune circuits depending on test results, or to repair defective regions of the chip by enabling spare or redundant circuits.

The typical method for providing fuses is to form small wires that can be selectively ablated with a precisely positioned laser beam to form open connections and closed connections, thereby encoding the necessary information as a series of bits. A drawback with this method is that the area required by the region damaged by each laser ablation is large. Another drawback of the method is the cost of using a separate tool or operation to carry out the laser fuse-blow which requires a sequence of test, fuse-blow and retest to assure proper chip functionality prior to final packaging.

In the present invention the wire fuse method is replaced with a method and apparatus wherein a circuit is provided that is permanently altered by electrical means during the final test sequence of the chip, thereby encoding the necessary information without a separate operation.

The present invention uses a novel channel hot-electron technique that employs scattering of hot electrons from the conducting channel of an FET device into the gate oxide. The technique of the present invention employs the temporary application voltages higher than used in conventional operation. For example, referring to FIG. 1, voltage V1 and V2 are turned on "hard" and cause the electrons "e" already in the channel 2 to degrade the oxide 4.

Figure 2:
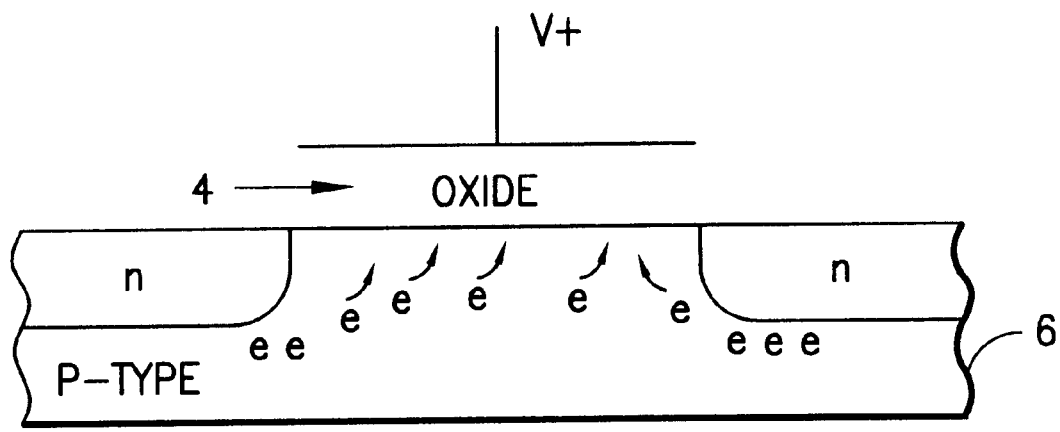
FIG. 2 is a schematic illustration of a hot carrier injection technique employed in the prior art.

The prior art, such s described in the cited Beilstein et al. publication, uses an injection hot-electron technique as illustrated in FIG. 2. In the injection hot-electron technique, hot carriers (electrons "e") from the substrate 6 are injected into the gate oxide 4. The Beilstein et al. injection hot-electron technique needs a "nearly forward biased junction" which is a key limitation. Beilstein et al. requires holding node A high and "raising and lowering the potential" of node B.

In Beilstein et al., care must be taken to assure enough forward bias junctions are present to provide excess carriers for each latch and care must also be taken to assure the excess carriers do not affect other circuitry.

In the present invention, using the Beilstein figure for purposes of explanation, V1 would be applied to node D, and nodes B and C would be held at a high potential for enough time (i.e. one to ten seconds), to allow device shifts to take place.

The present invention is distinct over the Beilstein et al. injection hot electron technique in the method of causing hot electron degradation. The advantages of the present invention are speed of programming and simplicity of implementation because no forward-biased diodes are required.

More particularly, an integrated circuit is provided with at least one component transistor wherein a constant high voltage is applied only once to the drain electrode of the transistor for one predetermined period of time while concurrently a constant voltage lower than the high voltage is applied only once to the gate electrode of the transistor, thus causing a permanent channel hot-electron alteration of a gate oxide of the transistor.

The integrated circuit may include a plurality of programmable circuits, each capable of assuming a plurality of readable data states when powered up, and each including a plurality of programmable devices for permanently biasing its corresponding programmable circuit to assume one of the readable states upon subsequent power ups.

Figure 3:
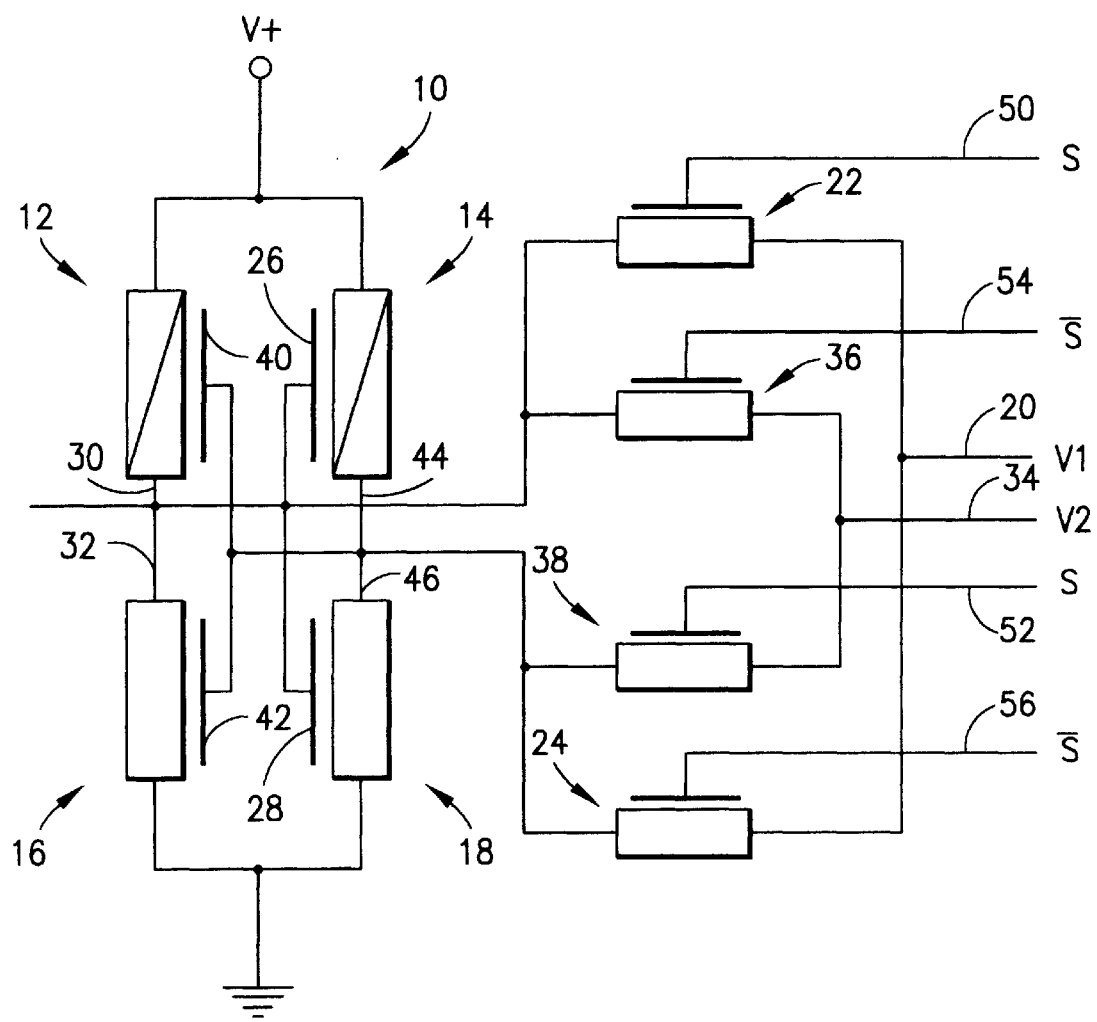
FIG. 3 is a schematic illustration of a latch circuit employed in the present invention.

Referring to FIG. 3, an embodiment of the present invention is shown with a MOSFET latch device 10 including pfet devices 12 and 14 and nfet devices 16 and 18. A first bias level voltage V1 is applied on lead 20 through switching devices 22 and 24 to the gate electrodes 26 and 28 of devices 14 and 18 and to the drain electrodes 30 and 32 of devices 12 and 16. A second bias voltage V2 is applied on lead 34 through switching devices 36 and 38 to the gate electrodes 40 and 42 of devices 12 and 16 and to the drain electrodes 44 and 46 of devices 14 and 18. The values of bias voltages V1 and V2 are chosen to cause hot-electron degradation by the alteration of the gate oxide of a selected one of the two nfet devices 16 or 18 that has bias voltage V1 applied to its gate and bias voltage V2 applied to its drain through the switching devices. Bias voltages V1 and V2 are also chosen so that the nfet devices 16 and 18 will not degrade when bias voltages V1 and V2 are switched and applied conversely, that is, when V2 is applied to the gate and V1 is applied to them drain of the one of the nfet devices 16 and 18.

The hot-electron degradation of either one of the nfet device 16 or 18 upsets the balance of the devices of latch 10 such that when the integrated circuit containing the latch circuit 10 of FIG. 3 is powered up, latch 10 assumes a first one of two readable data states when nfet 16 degrades and the second one of the two readable data states when nfet 18 degrades.

More particularly, when V1 is applied to gate 42 of device 16 and V2 is applied to the drain 32 of device 16, then device 16 degrades and latch 10 assumes the first readable data state. However, when V2 is applied to gate 28 of device 18 and V1 is applied to drain 32 of device 16, then device 16 does not degrade, or degrades much less.

Likewise, when V1 is applied to gate 28 of device 18 and V2 is applied to drain 46 of device 18, then device 18 degrades and latch 10 assumes the second readable data state. However when V2 is applied to gate 28 of device 18 and V1 is applied to drain 46 of device 18, then device 18 does not degrade.

Thus in FIG. 3 when switching signal S is present on leads 50 and 52 and switching signal S(bar) is present on leads 54 and 56, switching devices 22 and 38 are enabled, thereby connecting bias voltage V1 to gate 18 of device 28 of nfet device 18 and drain 32 of nfet device 16 and also connecting bias voltage V2 to gate 42 of device 16 and drain 46 of device 18, resulting in nfet device 18 degrading and latch circuit 10 assuming a first readable state when the circuit of FIG. 3 is powered up.

Figure 1:
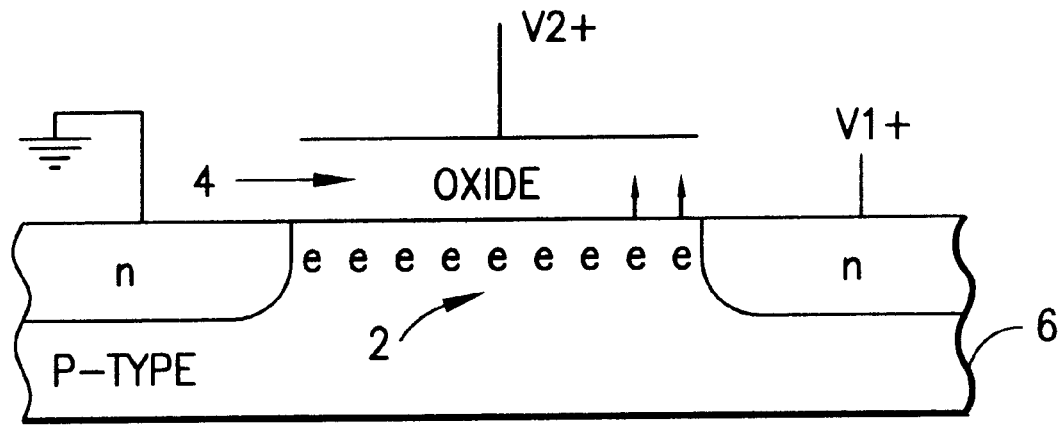
FIG. 1 is a schematic illustration of a channel hot-electron technique employed in the present invention.

However, when switching signal S is present on leads 54 and 56 and switching signal S(bar) is present on leads 50 and 52, switching devices 24 and 36 are enabled, thereby connecting bias voltage V1 to gate 42 of nfet device 16 and to drain 46 of nfet device 18 and also connecting bias voltage V2 to gate 28 of nfet device 18 and drain 32 of nfet device 16, resulting in nfet device 16 degrading and latch circuit 10 assuming a second readable data state when the circuit of FIG. 1 is powered up.

The described channel hot-electron degradation method is in practice carried out during the final test sequence of the integrated circuit, thereby forming the apparatus with the necessary encoded information without requiring a separate operation. The high bias voltage V2 and the lower bias voltage V1 are applied to the circuit of FIG. 3 only once concurrently for a predetermined period of time in order to effect the permanent hot-electron alteration of a selected transistor device. In practice, the lower bias voltage V1 may be, for example, 0.3 to 0.7 of the higher bias voltage V2.

What has been described is an apparatus and method for providing a programmable latch for fuse applications in an integrated circuit. The invention uses channel hot-electron degradation for altering selected ones of a plurality of devices in a latch circuit which forces the circuit to assume a selected one of either of two readable data states upon subsequent power up of the integrated circuit. The permanent hot-electron degradation of the devices provides method and apparatus that replaces the use of wire fuses, thereby allowing the use of standard CMOS technology and avoids mechanical damage and associated risk to the integrated circuit.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

We claim:

1. A method of programming an integrated circuit to always enter into a desired state upon power-up of the integrated circuit by permanently altering properties of at least one component MOSFET transistor, comprising the steps of:

a) applying only once a constant high voltage to a drain of the MOSFET transistor for one predetermined period of time; and b) applying only once concurrently with step a) a constant voltage lower than the high voltage by a factor of about 0.3 to about 0.7 to a gate of the transistor, including effecting a permanent channel hot electron alteration of a gate oxide of the MOSFET transistor by degrading the MOSFET transistor by damaging the physical properties of the MOSFET transistor such that the MOSFET transistor conducts less current.

2. An integrated circuit containing MOSFET transistor devices comprising:

a first power line for providing a first programming voltage to the integrated circuit, the first programming voltage sufficient to effect a channel hot-electron alteration in a control terminal of a MOSFET transistor device coupled to the first power line;

a second power line for providing a second programming voltage to the integrated circuit;

a plurality of programmable circuits each having a capability of automatically assuming a plurality of readable data states upon power up and each including a plurality of programmable MOSFET transistor devices for permanently biasing its corresponding programmable circuit to assume either one of the readable data states upon subsequent power ups; and the plurality of programmable circuits each further including a switching network for selectively coupling a control terminal of a first one of its programmable MOSFET transistor devices to the first power line and a second terminal of the first one of its programmable MOSFET transistor devices to the second power line for effecting a channel hot-electron alteration in the first one of its programmable MOSFET transistor devices by damaging the physical properties of the MOSFET transistor device so that the MOSFET transistor device conducts less current such that the programmable circuit is permanently biased to assume a first readable data state upon subsequent power ups, and for selectively coupling the control terminal of the second one of its programmable MOSFET transistor devices to the first power line and the second terminal of the second one of its programmable MOSFET transistor devices to the second power line for effecting a channel hot-electron alteration in the second one of its MOSFET transistor programmable devices by damaging the physical properties of the MOSFET transistor device so that the MOSFET transistor device conducts less current such that the programmable circuit is permanently biased to assume a second readable data state upon subsequent power ups.

3. The apparatus of claim 2, wherein the second programmable voltage is less than the first programmable voltage by a factor of about 0.3 to about 0.7.

4. A method of conditioning an integrated circuit to always enter into a selected data state upon power-up of the integrated circuit by permanently changing the properties of at least one component MOSFET transistor of a two-state latch circuit by channel hot-electron alteration comprising the steps of:

a) providing a latch circuit for the integrated circuit including at least two component MOSFET transistors having source, drain and gate electrodes;

b) applying a first bias voltage to the drain electrode of a first latch circuit MOSFET transistor; and c) concurrently applying with the first bias voltage of step b) a second bias voltage to the gate electrode of a second latch circuit MOSFET transistor to effect a programmed channel hot-electron alteration of the physical properties of the second MOSFET transistor by damaging the gate oxide of the second MOSFET transistor such that it conducts less current.

5. A method according to claim 4 wherein the channel hot-electron alteration of the second transistor causes the integrated circuit to enter into a selected data state upon power-up.

6. A method according to claim 4 wherein the first bias voltage is lower in magnitude than the second bias voltage.

7. A method according to claim 6 wherein the first bias voltage is lower in magnitude than the second bias voltage by a factor of 0.3 to 0.7.

8. A method according to claim 4 wherein the first and second bias voltages are applied concurrently to the latch circuit MOSFET transistors only once.

9. A method according to claim 4 wherein the first and second bias voltages are applied to the latch circuit MOSFET transistors through a pair of programmable switch devices.

10. An apparatus for conditioning an integrated circuit to always enter into a selected data state upon power-up by permanently changing the properties of a component transistor of a latch circuit by channel hot-electron alteration comprising:

a latch circuit connected in an integrated circuit, said latch circuit including at least two component MOSFET transistors each having source, drain and gate electrodes, a source of first bias voltage, a source of second bias voltage, switch means for selectively connecting said first bias voltage to the drain electrode of a first one of said at least two latch circuit MOSFET transistors and for applying said second bias voltage to the gate electrode of a second MOSFET latch circuit transistor to permanently change the properties of said second one of said at least two latch circuit MOSFET transistors by hot electron alteration of the physical properties of the MOSFET transistor such that the MOSFET transistor conducts less current.

11. An apparatus according to claim 10 wherein said second bias voltage effects the channel hot-electron permanent alteration of a gate oxide of said second transistor to cause said integrated circuit to enter into a selected data state upon power-up.

12. An apparatus according to claim 10 wherein said first bias voltage is lower in magnitude than said second bias voltage.

13. An apparatus according to claim 12 wherein said first bias voltage is lower in magnitude than said second bias voltage by a factor of 0.3 to 0.7.

14. An apparatus according to claim 10 wherein said first and second bias voltages are applied concurrently to said latch circuit MOSFET transistors only once.

15. A method according to claim 10 wherein said first and second bias voltages are applied to said latch circuit MOSFET transistors through a pair of programmable switch devices.

* * * * *